United States Patent
Liao

(10) Patent No.: US 11,343,419 B2
(45) Date of Patent: May 24, 2022

(54) FULL-SCREEN IMAGE DISPLAY AND OPTICAL ASSEMBLY THEREOF

(71) Applicant: ASTI GLOBAL INC., TAIWAN, Taichung (TW)

(72) Inventor: Chien-Shou Liao, New Taipei (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 190 days.

(21) Appl. No.: 16/881,108

(22) Filed: May 22, 2020

(65) Prior Publication Data

US 2021/0227111 A1 Jul. 22, 2021

(30) Foreign Application Priority Data

Jan. 22, 2020 (TW) ................................ 109102403

(51) Int. Cl.
| | | |
|---|---|---|
| *H04N 5/225* | (2006.01) | |
| *G02B 3/02* | (2006.01) | |
| *H05B 45/10* | (2020.01) | |
| *H05B 47/11* | (2020.01) | |
| *H01L 27/146* | (2006.01) | |
| *H01L 27/15* | (2006.01) | |

(Continued)

(52) U.S. Cl.
CPC ......... *H04N 5/2257* (2013.01); *G02B 3/0037* (2013.01); *G02B 3/02* (2013.01); *G09G 3/32* (2013.01); *H01L 27/14627* (2013.01); *H01L 27/156* (2013.01); *H01L 27/3234* (2013.01); *H01L 27/3267* (2013.01); *H01L 27/3269* (2013.01); *H01L 31/153* (2013.01); *H04N 5/2253* (2013.01); *H04N 5/2254* (2013.01); *H04N 5/2256* (2013.01); *H04N 5/247* (2013.01); *H04R 1/028* (2013.01); *H04R 1/08* (2013.01); *H04R 3/00* (2013.01); *H05B 45/10* (2020.01); *H05B 47/11* (2020.01); *G09G 2300/026* (2013.01); *G09G 2360/144* (2013.01); *H04R 2499/15* (2013.01); *H05B 47/115* (2020.01)

(58) Field of Classification Search
CPC ............ H04R 2499/15; H04R 2499/11; Y02B 20/40; G09G 2360/144; G09G 2300/026; G09G 2300/0404; H01L 25/167
See application file for complete search history.

(56) References Cited

U.S. PATENT DOCUMENTS

| | | | |
|---|---|---|---|
| 2004/0147807 A1* | 7/2004 | Viebach | A61B 1/00096 600/129 |
| 2018/0301494 A1* | 10/2018 | Park | H01L 27/3234 |
| 2019/0243149 A1* | 8/2019 | Iguchi | H01L 25/0753 |

* cited by examiner

*Primary Examiner* — Eileen M Adams
(74) *Attorney, Agent, or Firm* — Winston Hsu

(57) ABSTRACT

A full-screen image display and an optical assembly thereof are provided. The full-screen image display includes a first display module and a second display module. The first display module is an organic LED display, a liquid crystal display or an LED display for providing a first image, and the second display module is an LED display for providing a second image. The first display module and the second display module are adjacent or connected to each other, and the first image and the second image are combined to form a continuous image. The second display module includes a circuit substrate, an image display unit disposed on the circuit substrate, and a plurality of electronic units disposed on the circuit substrate. The image display unit includes a plurality of LED chips disposed on the circuit substrate, and the second image is provided by the LED chips.

10 Claims, 6 Drawing Sheets

(51) Int. Cl.
*H01L 31/153* (2006.01)
*H01L 27/32* (2006.01)
*G09G 3/32* (2016.01)
*H04N 5/247* (2006.01)
*H04R 1/02* (2006.01)
*H04R 1/08* (2006.01)
*H04R 3/00* (2006.01)
*G02B 3/00* (2006.01)
*H05B 47/115* (2020.01)

FULL-SCREEN IMAGE DISPLAY AND OPTICAL ASSEMBLY THEREOF

CROSS-REFERENCE TO RELATED PATENT APPLICATION

This application claims the benefit of priority to Taiwan Patent Application No. 109102403, filed on Jan. 22, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an image display and an assembly thereof, and more particularly to a full-screen image display and an optical assembly thereof.

BACKGROUND OF THE DISCLOSURE

A conventional image-capturing chip can be used to capture a complete image by matching a complete optical lens, but the complete optical lens is restricted in using.

SUMMARY OF THE DISCLOSURE

In response to the above-referenced technical inadequacies, the present disclosure provides a full-screen image display and an optical assembly thereof.

In one aspect, the present disclosure provides an optical assembly including a plurality of optical lenses arranged separate from each other and disposed on a same plane. The optical lenses are gradually inclined outwardly from an inner circle to an outer circle thereof, at least one of the optical lenses has a vertical optical axis, each of the other optical lenses has an inclined optical axis, and the vertical optical axis of the at least one optical lens and the inclined optical axis of each of the other optical lenses are intersected with each other, and a plurality of angles of the inclined optical axes of the other optical lenses relative to the vertical optical axis of the at least one optical lens are gradually increased from the inner circle to the outer circle of the optical lenses.

In another aspect, the present disclosure provides a full-screen image display, including a first display module and a second display module. The first display module is an organic LED display, a liquid crystal display or an LED display for providing a first image. The second display module is an LED display for providing a second image. The first display module and the second display module are adjacent or connected to each other, and the first image and the second image are combined to form a continuous image. The second display module includes a circuit substrate, an image display unit, a light-sensing unit, a light-projecting unit, an image-capturing unit and an audio signal transmitting unit, and the image display unit, the light-sensing unit, the light-projecting unit, the image-capturing unit and the audio signal transmitting unit are disposed on the circuit substrate. The image display unit includes a plurality of LED chips disposed on the circuit substrate, and the second image is provided by the LED chips. The image-capturing unit includes a first image capturer disposed on the circuit substrate and a second image capturer disposed on the circuit substrate, the first image capturer includes a plurality of first image-capturing chips for capturing invisible light and a plurality of first optical lenses respectively disposed above the first image-capturing chips, and the second image capturer includes a plurality of second image-capturing chips for capturing visible light and a plurality of second optical lenses respectively disposed above the second image-capturing chips. The first optical lenses are arranged separate from each other and disposed on a first plane, and the first optical lenses are gradually inclined outwardly from an inner circle to an outer circle thereof. The second optical lenses are arranged separate from each other and disposed on a second plane, and the second optical lenses are gradually inclined outwardly from an inner circle to an outer circle thereof. The at least one of the first optical lenses has a first vertical optical axis, each of the other first optical lenses has a first inclined optical axis, and the first vertical optical axis of the at least one first optical lens and the first inclined optical axis of each of the other first optical lenses are intersected with each other, and the angles of the first inclined optical axes of the other first optical lenses relative to the first vertical optical axis of the at least one first optical lens are gradually increased from the inner circle to the outer circle of the first optical lenses. The at least one of the second optical lenses has a second vertical optical axis, each of the other second optical lenses has a second inclined optical axis, and the second vertical optical axis of the at least one second optical lens and the second inclined optical axis of each of the other second optical lenses are intersected with each other, and the angles of the second inclined optical axes of the other second optical lenses relative to the second vertical optical axis of the at least one second optical lens are gradually increased from the inner circle to the outer circle of the second optical lenses.

In yet another aspect, the present disclosure provides a full-screen image display, including a first display module for providing a first image and a second display module for providing a second image. The first display module and the second display module are adjacent or connected to each other, and the first image and the second image are combined to form a continuous image. The second display module includes a circuit substrate, an image display unit disposed on the circuit substrate, and an image-capturing unit disposed on the circuit substrate. The image display unit includes a plurality of LED chips disposed on the circuit substrate, and the second image is provided by the LED chips. The image-capturing unit includes a first image capturer disposed on the circuit substrate and a second image capturer disposed on the circuit substrate, the first image capturer includes a plurality of first image-capturing chips and a plurality of first optical lenses respectively disposed above the first image-capturing chips, and the second image capturer includes a plurality of second image-capturing chips and a plurality of second optical lenses respectively disposed above the second image-capturing chips. The first optical lenses are arranged separate from each other and disposed on a first plane, and the first optical lenses are gradually inclined outwardly from an inner circle to an outer circle thereof. The second optical lenses are arranged separate from each other and disposed on a second plane, and the second optical lenses are gradually inclined outwardly from an inner circle to an outer circle thereof. The at least one of the first optical lenses has a first vertical optical axis, each of the other first optical lenses has a first inclined optical axis, and the first vertical optical axis of the at least one first optical lens and the first inclined optical axis of each of the other first optical lenses are intersected with each other, and the angles of the first inclined optical axes of the other first optical lenses relative to the first vertical optical axis of the at least one first optical lens are gradually increased from the inner circle to the outer circle of the first optical lenses. The at least one of the second optical lenses has a second vertical optical axis, each of the other second optical lenses has a second inclined optical axis, and the second vertical optical axis of the at least one second optical lens and the second inclined optical axis of each of the other second optical lenses are intersected with each other, and the angles of the second inclined optical axes of the other second optical lenses relative to the second vertical optical axis of the at least one second optical lens are gradually increased from the inner circle to the outer circle of the second optical lenses.

Therefore, by virtue of "the optical lenses being gradually outwardly inclined from inner to outer circle", "the vertical optical axis of the at least one optical lens and the inclined optical axis of each of the other optical lenses being intersected with each other" and "the angles of the inclined optical axes of the other optical lenses relative to the vertical optical axis of the at least one optical lens are gradually increased from the inner circle to the outer circle of the optical lenses", a complete image can be obtained by cooperation of all of the image-capturing chips and all of the optical lenses.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
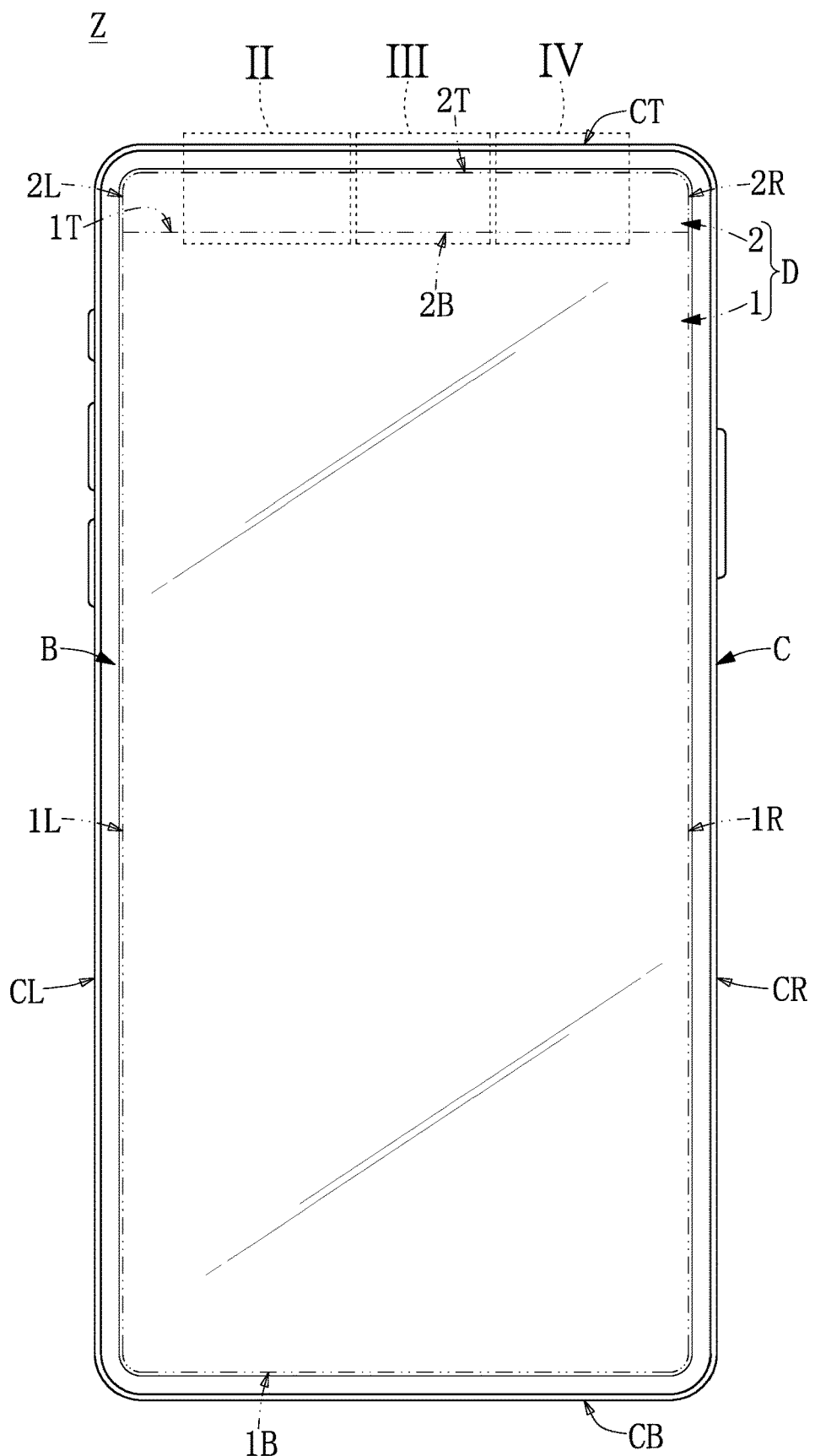
FIG. 1 is a schematic view of a portable electronic device according to a first embodiment of the present disclosure and a full-screen image display according to a second embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the present disclosure provides a portable electronic device Z including a frame structure C and a full-screen image display D surrounded by the frame structure C, and the full-screen image display D includes a first display module 1 for providing a first image, and a second display module 2 for providing a second image. In addition, the first display module 1 and the second display module 2 can be adjacent or connected to each other, so that the first image generated by the first display module 1 and the second image generated by the second display module 2 can be combined to form a continuous image.

For example, as shown in FIG. 1, the frame structure C has a left side CL, a right side CR, a top side CT and a bottom side CB, the first display module 1 has a left side 1L, a right side 1R, a top side 1T and a bottom side 1B, and the second display module 2 has a left side 2L, a right side 2R, a top side 2T and a bottom side 2B. In addition, the left side 1L of the first display module 1 is close or very close to the left side CL of the frame structure C, so that no exposed electronic element (such as image capturers, or sensors, etc.) is disposed between the left side 1L of the first display module 1 and the left side CL of the frame structure C (that is to say, there is an unoccupied region between the left side 1L of the first display module 1 and the left side CL of the frame structure C). The right side 1R of the first display module 1 is close or very close to the right side CR of the frame structure C, so that no exposed electronic element (such as an unoccupied region) is disposed between the right side 1R of the first display module 1 and the right side CR of the frame structure C. The bottom side 1B of the first display module 1 is close or very close to the bottom side CB of the frame structure C, so that no exposed electronic element (such as an unoccupied region) is disposed between the bottom side 1B of the first display module 1 and the bottom side CB of the frame structure C. Moreover, the left side 2L of the second display module 2 is close or very close to the left side CL of the frame structure C, so that no exposed electronic element (such as an unoccupied region)

is disposed between the left side 2L of the second display module 2 and the left side CL of the frame structure C. The right side 2R of the second display module 2 is close or very close to the right side CR of the frame structure C, so that no exposed electronic element (such as an unoccupied region) is disposed between the right side 2R of the second display module 2 and the right side CR of the frame structure C. The bottom side 2T of the second display module 2 is close or very close to the bottom side CT of the frame structure C, so that no exposed electronic element (such as an unoccupied region) is disposed between the bottom side 2T of the second display module 2 and the bottom side CT of the frame structure C. It should be noted that the top side 1T of the first display module 1 and the bottom side 2B of the second display module 2 can be adjacent or connected to each other. However, the aforementioned description of the first embodiment is merely an example and is not meant to limit the scope of the present disclosure.

For example, as shown in FIG. 1, the portable electronic device Z includes a surrounding light-shading layer B that is a continuous shape without any through hole. The first display module 1 and the second display module 2 can be surrounded by the surrounding light-shading layer B, and the surrounding light-shading layer B can be surrounded by the frame structure C. Therefore, a first region connected between the first display module 1 and the frame structure C can be shaded by the surrounding light-shading layer B, so that no exposed electronic element (such as image capturers, or sensors, etc.) is disposed on the first region connected between the first display module 1 and the frame structure C. In addition, a second region connected between the second display module 2 and the frame structure C can be shaded by the surrounding light-shading layer B, so that no exposed electronic element (such as image capturers, or sensors, etc.) is disposed on the second region connected between the second display module 2 and the frame structure C. However, the aforementioned description of the first embodiment is merely an example and is not meant to limit the scope of the present disclosure.

Second Embodiment

Referring to FIG. 1 to FIG. 6, a second embodiment of the present disclosure provides a full-screen image display D, including a first display module 1 for providing a first image, and a second display module 2 for providing a second image.

For example, the first display module 1 may be an organic LED (OLED) display, a liquid crystal display (LCD), an LED display or any type of first display for providing a first image, and the second display module 2 may be an LED display or any type of second display for providing a second. In addition, the first display module 1 and the second display module 2 can be adjacent or connected to each other, so that the first image generated by the first display module 1 and the second image generated by the second display module 2 can be combined to form a continuous image. However, the aforementioned description of the second embodiment is merely an example and is not meant to limit the scope of the present disclosure.

For example, referring to FIG. 1 to FIG. 4, the second display module 2 includes a circuit substrate 20, an image display unit 21 disposed on the circuit substrate 20, and a plurality of electronic units disposed on the circuit substrate 20. In addition, the electronic units can be divided into a light-sensing unit, a light-projecting unit, an image-capturing unit and an audio signal transmitting unit, and image display unit 21, the light-sensing unit, the light-projecting unit, the image-capturing unit and the audio signal transmitting unit are disposed on the circuit substrate 20. It should be noted that the image display unit 21 includes a plurality of LED chips 210 disposed on the circuit substrate 20, and the second image can be provided by the LED chips 210. However, the aforementioned description of the second embodiment is merely an example and is not meant to limit the scope of the present disclosure.

Figure 2:
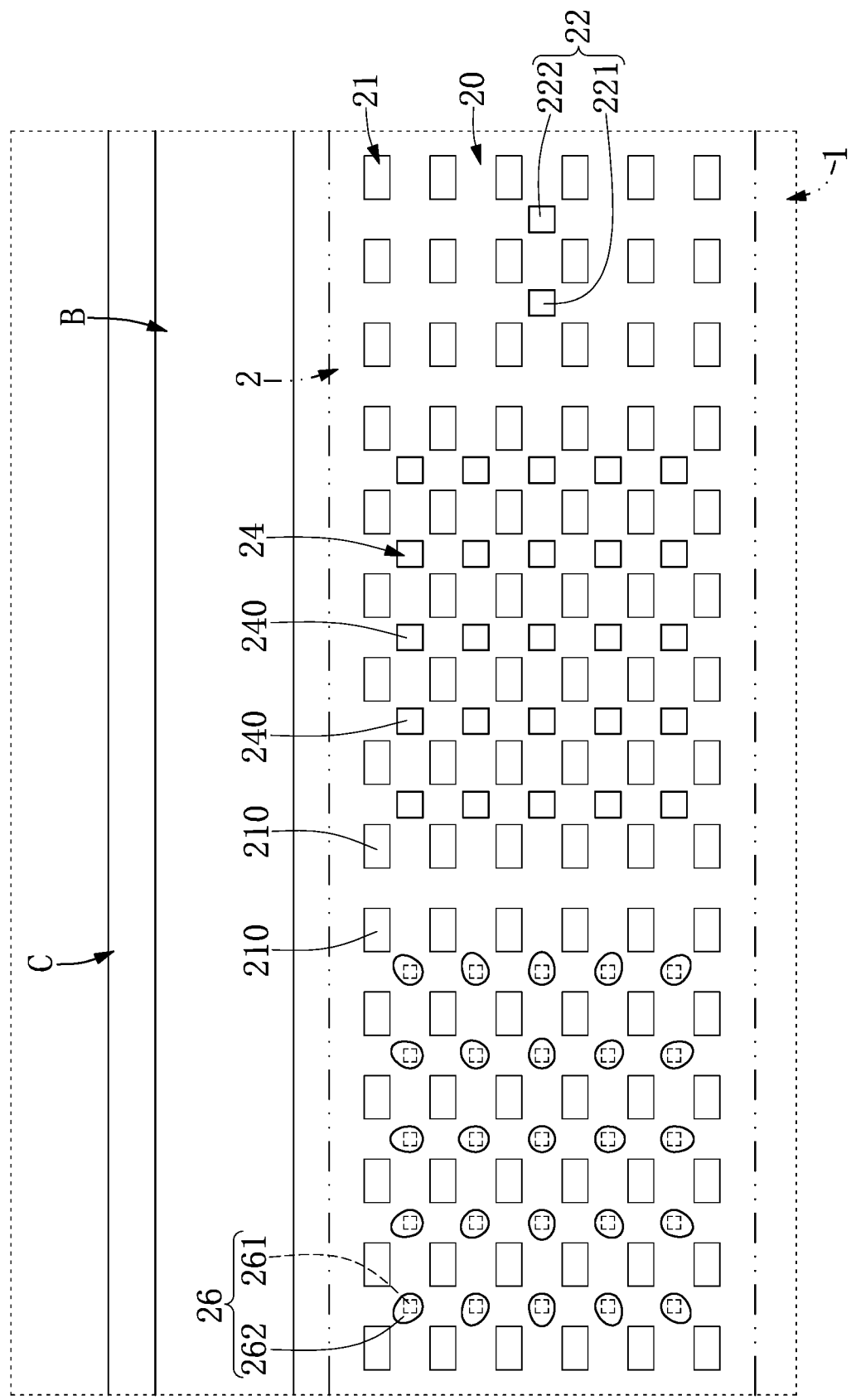
FIG. 2 shows an enlarged view of part I of FIG. 1.
Figure 3:
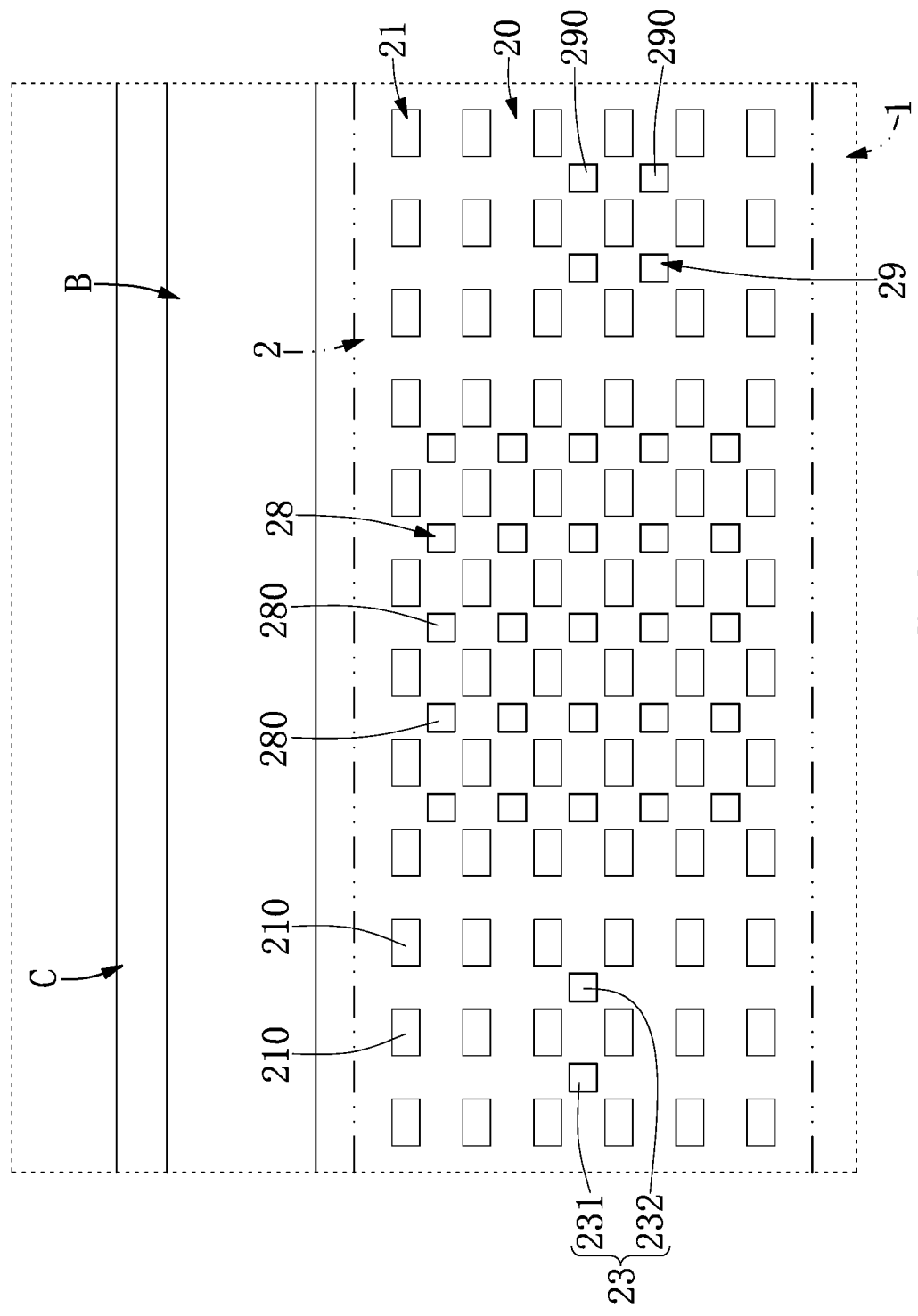
FIG. 3 shows an enlarged view of part III of FIG. 1.

For example, referring to FIG. 1 to FIG. 3, the light-sensing unit includes an ambient light sensor 22 disposed on the circuit substrate 20 and a proximity sensor 23 disposed on the circuit substrate 20. In addition, the ambient light sensor 22 includes a first light generating chip 221 for generating a first light source and a first light receiving chip 222 for receiving the first light source that has been reflected, and the ambient light sensor 22 can provide an ambient brightness information by cooperation of the first light generating chip 221 and the first light receiving chip 222. Moreover, the proximity sensor 23 includes a second light generating chip 231 for generating a second light source and a second light receiving chip 232 for receiving the second light source that has been reflected, and the proximity sensor 23 can provide a depth information of field by cooperation of the second light generating chip 231 and the second light receiving chip 232. Furthermore, the first light generating chip 221 can be disposed between any two adjacent ones of the LED chips 210, and the first light receiving chip 222 can be disposed between any two adjacent ones of the LED chips 210. The second light generating chip 231 can be disposed between any two adjacent ones of the LED chips 210, and the second light receiving chip 232 can be disposed between any two adjacent ones of the LED chips 210. However, the aforementioned description of the second embodiment is merely an example and is not meant to limit the scope of the present disclosure.

Figure 4:
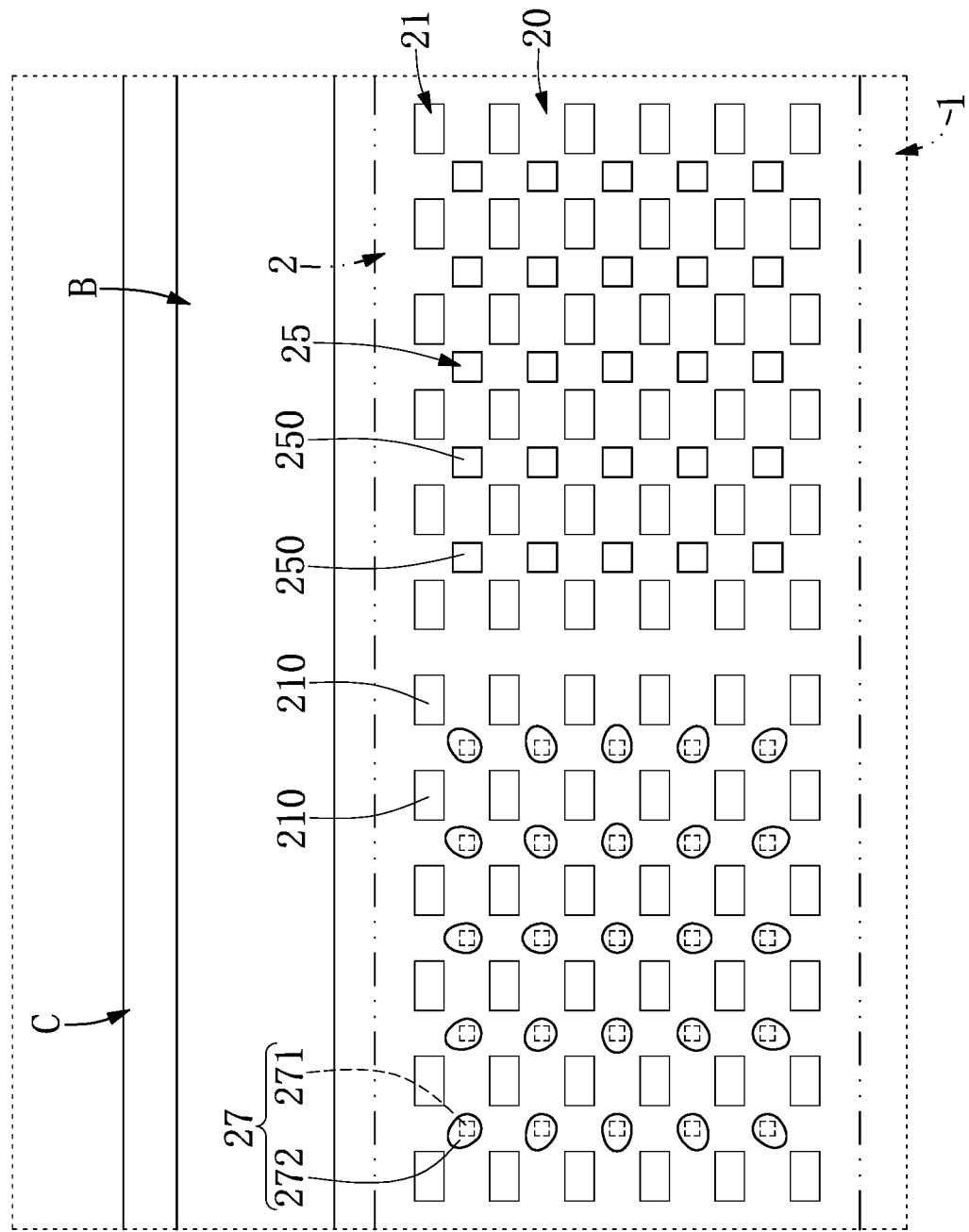
FIG. 4 shows an enlarged view of part IV of FIG. 1.

For example, referring to FIG. 1, FIG. 2 and FIG. 4, the light-projecting unit includes a flood illuminator 24 disposed on the circuit substrate 20 and a dot projector 25 disposed on the circuit substrate 20. The flood illuminator 24 includes a plurality of infrared (IR) light generating chips 240 that are arranged to form a first predetermined shape, and the dot projector 25 includes a plurality of invisible light generating chips 250 that are arranged to form a second predetermined shape. In addition, each of the infrared light generating chips 240 can be disposed between any two adjacent ones of the LED chips 210, and each of the invisible light generating chips 250 can be disposed between any two adjacent ones of the LED chips 210. However, the aforementioned description of the second embodiment is merely an example and is not meant to limit the scope of the present disclosure.

For example, referring to FIG. 1, FIG. 2 and FIG. 4, the image-capturing unit includes a first image capturer 26 (such as an image capturing device) disposed on the circuit substrate 20 and a second image capturer 27 disposed on the circuit substrate 20. In addition, the first image capturer 26 may be an infrared camera, and the first image capturer 26 includes a plurality of first image-capturing chips 261 for capturing invisible light and a plurality of first optical lenses 262 (such as a first optical assembly) respectively disposed above the first image-capturing chips 261. Moreover, the second image capturer 27 may be a front camera, and the second image capturer 27 includes a plurality of second image-capturing chips 271 for capturing visible light and a plurality of second optical lenses 272 (such as a second optical assembly) respectively disposed above the second image-capturing chips 271. Furthermore, each of the first image-capturing chips 261 can be disposed between any two adjacent ones of the LED chips 210, and each of the second image-capturing chips 271 can be disposed between any two adjacent ones of the LED chips 210. However, the aforementioned description of the second embodiment is merely an example and is not meant to limit the scope of the present disclosure.

For example, referring to FIG. 1 and FIG. 3, the audio signal transmitting unit includes a speaker 28 disposed on the circuit substrate 20 and a microphone 29 disposed on the circuit substrate 20. In addition, the speaker 28 includes a plurality of audio signal generating chips 280 that are arranged to form a first predetermined shape, and the microphone 29 includes a plurality of audio signal receiving chips 290 that are arranged to form a second predetermined shape. Moreover, each of the audio signal generating chips 280 can be disposed between any two adjacent ones of the LED chips 210, and each of the audio signal receiving chips 290 can be disposed between any two adjacent ones of the LED chips 210. However, the aforementioned description of the second embodiment is merely an example and is not meant to limit the scope of the present disclosure.

Figure 5:
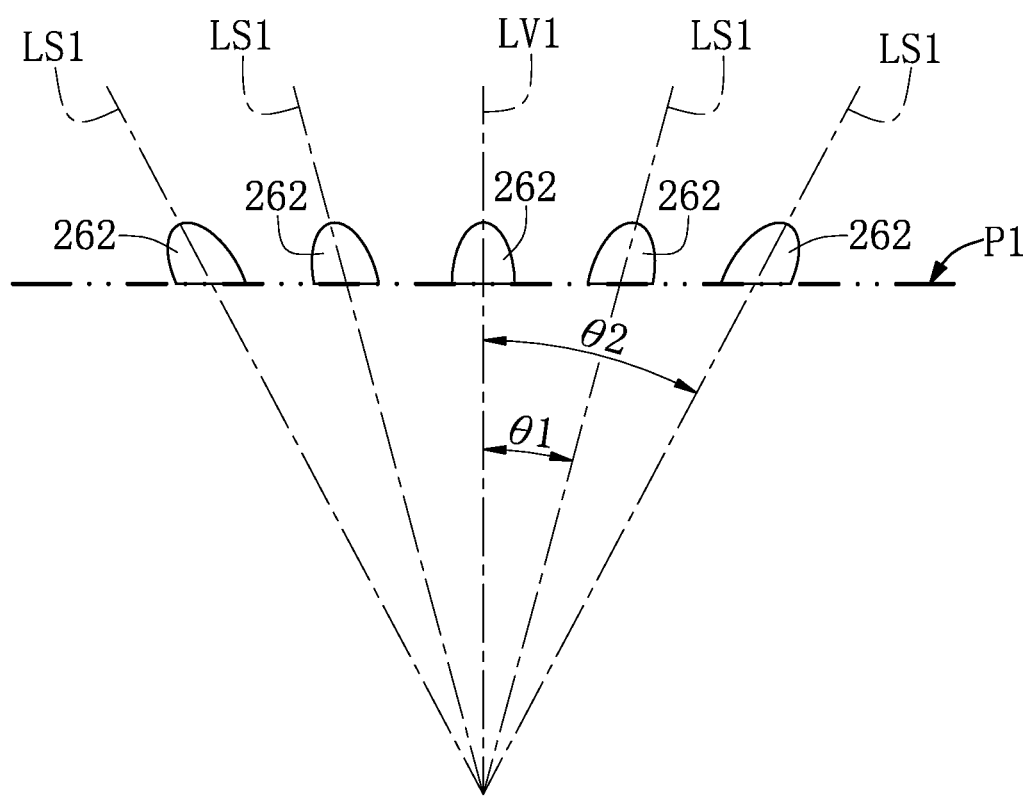
FIG. 5 is a lateral schematic view of a plurality of first optical lenses of a first image capturer of the full-screen image display according to the second embodiment of the present disclosure.

It should be noted that the first optical lenses 262 can be arranged separate from each other and disposed on a first plane P1, and the first optical lenses 262 can be gradually outwardly inclined from inner to outer circle (from inner circle to outer circle) as shown in FIG. 2 and FIG. 5 (for example, the first optical lenses 262 can be gradually inclined outwardly in a centrifugal and bottom-up direction from an inner circle to an outer circle thereof). In addition, at least one of the first optical lenses 262 has a first vertical optical axis LV1, each of the other first optical lenses 262 has a first inclined optical axis LS1. Moreover, the first vertical optical axis LV1 of the at least one first optical lens 262 and the first inclined optical axis LS1 of each of the other first optical lenses 262 are intersected (or alternated) with each other, and the angles (θ1, θ2) of the first inclined optical axes LS1 of the other first optical lenses 262 relative to the first vertical optical axis LV1 of the at least one first optical lens 262 are gradually increased from the inner circle to the outer circle of the first optical lenses 262 (that is to say θ1<θ2). More particularly, a part of a complete image can be captured by cooperation of the corresponding first image-capturing chip 261 and the corresponding first optical lenses 262, so that the complete image can be obtained by cooperation of all of the first image-capturing chips 261 and all of the first optical lenses 262.

Figure 6:
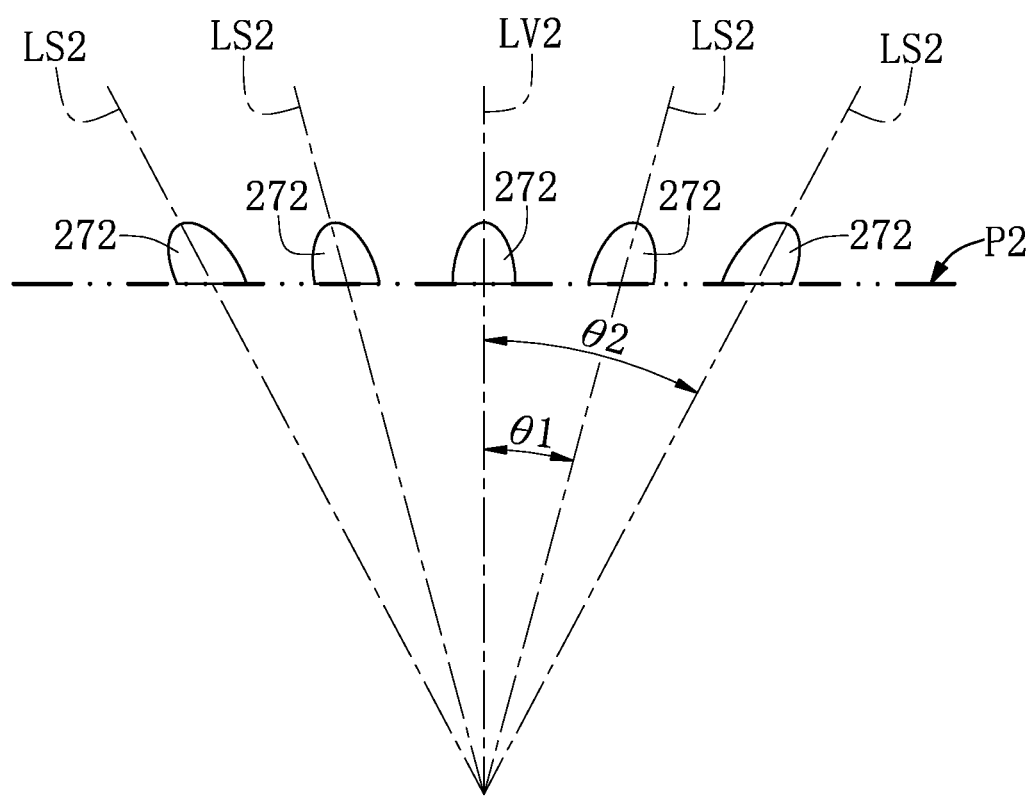
FIG. 6 is a lateral schematic view of a plurality of second optical lenses of a second image capturer of the full-screen image display according to the second embodiment of the present disclosure.

It should be noted that the second optical lenses 272 can be arranged separate from each other and disposed on a second plane P2, and the second optical lenses 272 can be gradually outwardly inclined from inner to outer circle (from inner circle to outer circle) as shown in FIG. 2 and FIG. 6 (for example, the second optical lenses 272 can be gradually inclined outwardly in a centrifugal and bottom-up direction from an inner circle to an outer circle thereof). In addition, at least one of the second optical lenses 272 has a second vertical optical axis LV2, each of the other second optical lenses 262 has a second inclined optical axis LS2. Moreover, the second vertical optical axis LV2 of the at least one second optical lens 272 and the second inclined optical axis LS2 of each of the other second optical lenses 272 are intersected (or alternated) with each other, and the angles (θ1, θ2) of the second inclined optical axes LS2 of the other second optical lenses 272 relative to the second vertical optical axis LV2 of the at least one second optical lens 272 are gradually increased from the inner circle to the outer circle of the second optical lenses 272 (that is to say θ1<θ2). More particularly, a part of a complete image can be captured by cooperation of the corresponding second image-capturing chip 271 and the corresponding second optical lenses 272, so that the complete image can be obtained by cooperation of all of the second image-capturing chips 271 and all of the second optical lenses 272.

In conclusion, by virtue of "the optical lenses (such as the first optical lenses 262 or the second optical lenses 272) being gradually outwardly inclined from inner to outer circle", "the vertical optical axis (such as the first vertical optical axis LV1 or the second vertical optical axis LV2) of the at least one optical lens and the inclined optical axis (such as the first inclined optical axes LS1 or the second inclined optical axis LS2) of each of the other optical lenses being intersected with each other" and "the angles (θ1, θ2) of the inclined optical axes of the other optical lenses relative to the vertical optical axis of the at least one optical lens are gradually increased from the inner circle to the outer circle of the optical lenses", a complete image can be obtained by cooperation of all of the image-capturing chips (such as the first image-capturing chips 261 or the second image-capturing chips 271) and all of the optical lenses (such as the first optical lenses 262 or the second optical lenses 272).

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical assembly comprising a plurality of optical lenses arranged separate from each other and disposed on a same plane, wherein the optical lenses are gradually inclined outwardly from an inner circle to an outer circle thereof, at least one of the optical lenses has a vertical optical axis, each of the other optical lenses has an inclined optical axis passing through a vertex of each of the other optical lenses, and the vertical optical axis of the at least one optical lens and the inclined optical axis of each of the other optical lenses are intersected with each other, and a plurality of angles of the inclined optical axes of the other optical lenses relative to the vertical optical axis of the at least one optical lens are gradually increased from the inner circle to the outer circle of the optical lenses.

2. The optical assembly according to claim 1, wherein the optical lenses are respectively disposed above a plurality of image-capturing chips that are arranged separate from each other.

3. A full-screen image display, comprising:
a first display module that is an organic LED display, a liquid crystal display or an LED display for providing a first image; and
a second display module that is an LED display for providing a second image;
wherein the first display module and the second display module are adjacent or connected to each other, and the first image and the second image are combined to form a continuous image;

wherein the second display module includes a circuit substrate, an image display unit, a light-sensing unit, a light-projecting unit, an image-capturing unit and an audio signal transmitting unit, and the image display unit, the light-sensing unit, the light-projecting unit, the image-capturing unit and the audio signal transmitting unit are disposed on the circuit substrate;

wherein the image display unit includes a plurality of LED chips disposed on the circuit substrate, and the second image is provided by the LED chips;

wherein the image-capturing unit includes a first image capturer disposed on the circuit substrate and a second image capturer disposed on the circuit substrate, the first image capturer includes a plurality of first image-capturing chips for capturing invisible light and a plurality of first optical lenses respectively disposed above the first image-capturing chips, and the second image capturer includes a plurality of second image-capturing chips for capturing visible light and a plurality of second optical lenses respectively disposed above the second image-capturing chips;

wherein the first optical lenses are arranged separate from each other and disposed on a first plane, and the first optical lenses are gradually inclined outwardly from an inner circle to an outer circle thereof;

wherein the second optical lenses are arranged separate from each other and disposed on a second plane, and the second optical lenses are gradually inclined outwardly from an inner circle to an outer circle thereof;

wherein at least one of the first optical lenses has a first vertical optical axis, each of the other first optical lenses has a first inclined optical axis, and the first vertical optical axis of the at least one first optical lens and the first inclined optical axis of each of the other first optical lenses are intersected with each other, and the angles of the first inclined optical axes of the other first optical lenses relative to the first vertical optical axis of the at least one first optical lens are gradually increased from the inner circle to the outer circle of the first optical lenses;

wherein at least one of the second optical lenses has a second vertical optical axis, each of the other second optical lenses has a second inclined optical axis, and the second vertical optical axis of the at least one second optical lens and the second inclined optical axis of each of the other second optical lenses are intersected with each other, and the angles of the second inclined optical axes of the other second optical lenses relative to the second vertical optical axis of the at least one second optical lens are gradually increased from the inner circle to the outer circle of the second optical lenses.

4. The full-screen image display according to claim 3, wherein the light-sensing unit includes an ambient light sensor disposed on the circuit substrate and a proximity sensor disposed on the circuit substrate, the ambient light sensor includes a first light generating chip for generating a first light source and a first light receiving chip for receiving the first light source, and the proximity sensor includes a second light generating chip for generating a second light source and a second light receiving chip for receiving the second light source; wherein the first light generating chip is disposed between any two adjacent ones of the LED chips, and the first light receiving chip is disposed between any two adjacent ones of the LED chips; wherein the second light generating chip is disposed between any two adjacent ones of the LED chips, and the second light receiving chip is disposed between any two adjacent ones of the LED chips.

5. The full-screen image display according to claim 3, wherein the light-projecting unit includes a flood illuminator disposed on the circuit substrate and a dot projector disposed on the circuit substrate, the flood illuminator includes a plurality of infrared light generating chips that are arranged to form a predetermined shape, and the dot projector includes a plurality of invisible light generating chips that are arranged to form a predetermined shape; wherein each of the infrared light generating chips is disposed between any two adjacent ones of the LED chips, and each of the invisible light generating chips is disposed between any two adjacent ones of the LED chips.

6. The full-screen image display according to claim 3, wherein the audio signal transmitting unit includes a speaker disposed on the circuit substrate and a microphone disposed on the circuit substrate, the speaker includes a plurality of audio signal generating chips that are arranged to form a predetermined shape, and the microphone includes a plurality of audio signal receiving chips that are arranged to form a predetermined shape; wherein each of the audio signal generating chips is disposed between any two adjacent ones of the LED chips, and each of the audio signal receiving chips is disposed between any two adjacent ones of the LED chips.

7. A full-screen image display, comprising:
a first display module for providing a first image; and
a second display module for providing a second image;
wherein the first display module and the second display module are adjacent or connected to each other, and the first image and the second image are combined to form a continuous image;
wherein the second display module includes a circuit substrate, an image display unit disposed on the circuit substrate, and an image-capturing unit disposed on the circuit substrate;
wherein the image display unit includes a plurality of LED chips disposed on the circuit substrate, and the second image is provided by the LED chips;
wherein the image-capturing unit includes a first image capturer disposed on the circuit substrate and a second image capturer disposed on the circuit substrate, the first image capturer includes a plurality of first image-capturing chips and a plurality of first optical lenses respectively disposed above the first image-capturing chips, and the second image capturer includes a plurality of second image-capturing chips and a plurality of second optical lenses respectively disposed above the second image-capturing chips;
wherein the first optical lenses are arranged separate from each other and disposed on a first plane, and the first optical lenses are gradually inclined outwardly from an inner circle to an outer circle thereof;
wherein the second optical lenses are arranged separate from each other and disposed on a second plane, and the second optical lenses are gradually inclined outwardly from an inner circle to an outer circle thereof;
wherein at least one of the first optical lenses has a first vertical optical axis, each of the other first optical lenses has a first inclined optical axis, and the first vertical optical axis of the at least one first optical lens and the first inclined optical axis of each of the other first optical lenses are intersected with each other, and the angles of the first inclined optical axes of the other first optical lenses relative to the first vertical optical axis of the at least one first optical lens are gradually increased from the inner circle to the outer circle of the first optical lenses;

wherein at least one of the second optical lenses has a second vertical optical axis, each of the other second optical lenses has a second inclined optical axis, and the second vertical optical axis of the at least one second optical lens and the second inclined optical axis of each of the other second optical lenses are intersected with each other, and the angles of the second inclined optical axes of the other second optical lenses relative to the second vertical optical axis of the at least one second optical lens are gradually increased from the inner circle to the outer circle of the second optical lenses.

8. The full-screen image display according to claim 7, wherein the second display module includes a light-sensing unit disposed on the circuit substrate, the light-sensing unit includes an ambient light sensor disposed on the circuit substrate and a proximity sensor disposed on the circuit substrate, the ambient light sensor includes a first light generating chip for generating a first light source and a first light receiving chip for receiving the first light source, and the proximity sensor includes a second light generating chip for generating a second light source and a second light receiving chip for receiving the second light source; wherein the first light generating chip is disposed between any two adjacent ones of the LED chips, and the first light receiving chip is disposed between any two adjacent ones of the LED chips; wherein the second light generating chip is disposed between any two adjacent ones of the LED chips, and the second light receiving chip is disposed between any two adjacent ones of the LED chips.

9. The full-screen image display according to claim 7, wherein the second display module includes a light-projecting unit disposed on the circuit substrate, the light-projecting unit includes a flood illuminator disposed on the circuit substrate and a dot projector disposed on the circuit substrate, the flood illuminator includes a plurality of infrared light generating chips that are arranged to form a predetermined shape, and the dot projector includes a plurality of invisible light generating chips that are arranged to form a predetermined shape; wherein each of the infrared light generating chips is disposed between any two adjacent ones of the LED chips, and each of the invisible light generating chips is disposed between any two adjacent ones of the LED chips.

10. The full-screen image display according to claim 7, wherein the second display module includes an audio signal transmitting unit disposed on the circuit substrate, the audio signal transmitting unit includes a speaker disposed on the circuit substrate and a microphone disposed on the circuit substrate, the speaker includes a plurality of audio signal generating chips that are arranged to form a predetermined shape, and the microphone includes a plurality of audio signal receiving chips that are arranged to form a predetermined shape; wherein each of the audio signal generating chips is disposed between any two adjacent ones of the LED chips, and each of the audio signal receiving chips is disposed between any two adjacent ones of the LED chips.

* * * * *